US012785679B2

(12) United States Patent
Li et al.

(10) Patent No.: US 12,785,679 B2
(45) Date of Patent: Nov. 3, 2026

(54) RADIO-FREQUENCY SWITCH CIRCUIT SUPPORTING HIGH-POWER MODE, CHIP, AND ELECTRONIC DEVICE

(71) Applicant: SHANGHAI VANCHIP TECHNOLOGIES CO., LTD., Shanghai (CN)

(72) Inventors: Yanli Li, Shanghai (CN); Silong Zhang, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 19/031,985

(22) Filed: Jan. 18, 2025

(65) Prior Publication Data

US 2025/0379577 A1 Dec. 11, 2025

Related U.S. Application Data

(63) Continuation of application No. PCT/CN2023/108490, filed on Jul. 20, 2023.

(30) Foreign Application Priority Data

Jul. 25, 2022 (CN) ......................... 202210880652.3

(51) Int. Cl.
*H03K 17/687* (2006.01)
*H03K 17/693* (2006.01)

(52) U.S. Cl.
CPC ....... *H03K 17/6871* (2013.01); *H03K 17/693* (2013.01)

(58) Field of Classification Search
CPC ............ H03K 17/6871; H03K 17/687; H03K 17/693; H03K 17/145; H03K 2217/0036; H03K 17/56; H03K 17/6874; H03K 17/735; H03H 11/02; H03H 11/28; H03H 11/30; H04B 1/44; H04B 1/48; H04B 2001/485
See application file for complete search history.

(56) References Cited

U.S. PATENT DOCUMENTS 9,013,225 B2 * 4/2015 Madan ................ H03K 17/162 327/436

* cited by examiner

*Primary Examiner* — Jung Kim
(74) *Attorney, Agent, or Firm* — George Guosheng Wang; Upstream Research and Patent LLC

(57) ABSTRACT

Disclosed are a radio-frequency switch circuit supporting a high-power mode, a chip, and an electronic device. The radio-frequency switch circuit is formed by connecting multiple stages of switch transistor units in series. In each stage of switch transistor unit, a gate of a first transistor is connected to a gate bias resistor, and the other end of the gate bias resistor is connected to a gate bias voltage; a drain of the first transistor is connected to a source of a first transistor in the previous stage of switch transistor unit, and a source of the first transistor is connected to a drain of a first transistor in the next stage of switch transistor unit; two ends of a path resistor are respectively connected to the drain and source of the first transistor.

10 Claims, 6 Drawing Sheets

RADIO-FREQUENCY SWITCH CIRCUIT SUPPORTING HIGH-POWER MODE, CHIP, AND ELECTRONIC DEVICE

BACKGROUND

Technical Field

The present invention relates to a radio frequency switch circuit supporting a high-power mode and also relates to a chip and a corresponding electronic device including the radio frequency switch circuit, and belongs to the field of radio frequency integrated circuit technologies.

Related Art

In the field of communications technologies, a radio frequency switch circuit serves as one of important components of a radio frequency front-end module, and functions to accurately switch and control a transmission path of a radio frequency signal, perform gating for a corresponding radio frequency path, and receive/transmit a radio frequency signal when wireless communications systems share an antenna.

Generally, performance indicator requirements of a fifth-generation (5G) communications system on a radio frequency switch circuit are: a higher power output capability (that is, supporting a high-power mode), a higher isolation degree, better linearity, and a lower insertion loss. At the same time, the radio frequency switch circuit is expected to have a relatively small chip size and relatively low production costs. In the prior art, a method for improving a power output capability of a radio frequency switch circuit is generally a transistor stack method. In this method, the radio frequency switch circuit is formed by a plurality of switch transistor units in series. A typical circuit thereof is shown in FIG. 1. The radio frequency switch circuit is formed by switch transistors M1, M2, . . . , and Mn (n is a positive integer, and n≥3) in series. A drain of the switch transistor M1 is connected to a signal input end RFin of the radio frequency switch circuit, and a source of the switch transistor Mn is connected to a signal output end RFout of the radio frequency switch circuit. A gate bias voltage Vg passes through gate bias resistors RG and is connected to gates of all switch transistors, and a body bias voltage Vb passes through body bias resistors $R_B$ and is connected to bodies of all the switch transistors. A path resistor Rds is connected in parallel between a drain and a source of each switch transistor. Although the radio frequency switch circuit can improve a power output capability, there are still two problems: On one hand, distribution of a voltage swing of a radio frequency switch circuit in a stack chain of a switch transistor is uneven. Consequently, improvement of a power output capability of the radio frequency switch circuit is limited. On the other hand, an increase in a quantity of stacked switch transistors in a radio frequency switch circuit causes an increase in insertion loss and an increase in a chip area occupied by the radio frequency switch circuit.

SUMMARY

A first technical problem to be resolved by the present invention is to provide a radio frequency switch circuit supporting a high-power mode.

Another technical problem to be resolved by the present invention is to provide a chip and a corresponding electronic device including the foregoing radio frequency switch circuit.

In order to achieve the above purpose, the present invention adopts the following technical solutions:

According to a first aspect of the embodiments of the present invention, a radio frequency switch circuit supporting a high-power mode is provided, including a plurality of stages of switch transistor units connected in series; where each stage of switch transistor unit includes a first transistor, a second transistor, a third transistor, a gate bias resistor, and a path resistor;

a gate of the first transistor is connected to the gate bias resistor, and another end of the gate bias resistor is connected to a gate bias voltage; a drain of the first transistor is connected to a source of a first transistor in a previous stage of switch transistor unit, and a source of the first transistor is connected to a drain of a first transistor in a next stage of switch transistor unit;

two ends of the path resistor are respectively connected to the drain and the source of the first transistor, and a body of the first transistor is connected to each of a source of the second transistor and a source of the third transistor; and a gate of the second transistor is connected to the source of the first transistor, and a gate of the third transistor is connected to the drain of the first transistor.

Preferably, a drain of the second transistor is connected to a second resistor, and another end of the second resistor is connected to a gate of the first transistor in the previous stage of switch transistor unit; and a drain of the third transistor is connected to a third resistor, and another end of the third resistor is connected to a gate of the first transistor in the next stage of switch transistor unit.

Preferably, the gate of the first transistor is connected to each of a second resistor in the next stage of switch transistor unit and a third resistor in the previous stage of switch transistor unit.

Preferably, a fifth resistor and a first capacitor are further included at the start stage of the plurality of stages of switch transistor units;

one end of the fifth resistor is connected to a gate of a first transistor in the current stage of switch transistor unit, and another end of the fifth resistor is connected to the first capacitor; and another end of the first capacitor is connected to a drain of the first transistor.

Preferably, the drain of the first transistor is connected to a signal input end of the radio frequency switch circuit.

Preferably, a sixth resistor and a second capacitor are further included at the end stage of the plurality of stages of switch transistor units;

one end of the sixth resistor is connected to a gate of a first transistor in the current stage of switch transistor unit, and another end of the sixth resistor is connected to the second capacitor; and another end of the second capacitor is connected to a source of the first transistor.

Preferably, the source of the first transistor is connected to a signal output end of the radio frequency switch circuit.

Preferably, the gate bias resistors in the stages of switch transistor units are sequentially connected to each other in series, and then are connected to the gate bias voltage.

According to a second aspect of the embodiments of the present invention, a radio frequency switch chip is provided, the radio frequency switch chip including the foregoing radio frequency switch circuit.

According to a third aspect of the embodiments of the present invention, an electronic device is provided, the electronic device including the foregoing radio frequency switch circuit.

In the radio frequency switch circuit supporting a high-power mode provided in the present invention, on one hand, a technical solution in which a gate of each stage of switch transistor is connected to a gate bias voltage by using a resistor structure is provided. On the other hand, a technical solution in which a bias circuit formed by a switch transistor and a resistor is used for a body of each stage of switch transistor and an end of the bias circuit is connected to a gate of the switch transistor is provided. This effectively alleviates uneven distribution of a voltage swing in a stack chain of each stage of switch transistor, so that a non-linearity problem of the radio frequency switch circuit is alleviated, insertion loss is reduced, and a power output capability is obviously improved. Therefore, the radio frequency switch circuit supporting a high-power mode provided in the present invention has beneficial effects such as skillful structural design, relatively low production costs, a relatively small chip size, and excellent operating performance.

DETAILED DESCRIPTION

Further detailed explanation of the technical solution of the present invention will be provided with reference to the accompanying drawings and specific embodiments.

Figure 1:
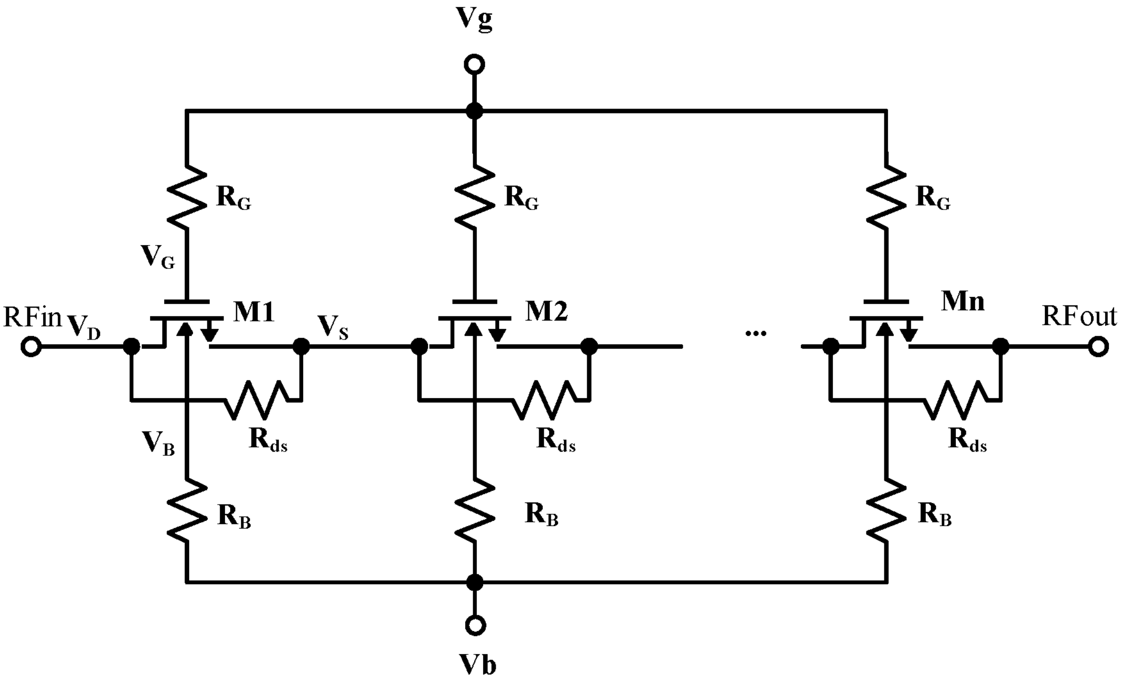
(Prior Art) FIG. 1
FIG. 1 is a diagram of a circuit principle of a typical radio frequency switch circuit in the prior art.

As described above, when the existing radio frequency switch circuit shown in FIG. 1 is in a turned-off state, due to reasons such as a component performance difference and a circuit structure, voltage differences between sources and drains of stages of transistors connected in series are usually unevenly distributed. Besides, as power of an input radio frequency signal increases, voltage differences between drains or sources and bodies of the stages of transistors gradually increase.

Specifically, on one hand, when a drain voltage $V_D$ of a transistor increases and starts to be greater than 0 and reaches a particular value, a direct current is generated at a reverse PN junction between a drain and a body. The direct current generates a voltage drop at a body bias resistor $R_B$, so that a body voltage $V_B$ is increased. After a voltage difference between a body and a source of a transistor increases and reaches a particular value, a PN junction between the body and the source is turned on. Consequently, a large quantity of harmonics are sharply generated in the radio frequency switch circuit, a serious non-linearity problem is caused, and a power output capability of the radio frequency switch circuit is seriously reduced.

On the other hand, when a drain voltage $V_D$ of a transistor decreases and starts to be less than 0 and reaches a particular value, a direct current is generated at a reverse PN junction between the source and the body. The direct current generates a voltage drop at a body bias resistor $R_B$, so that a body voltage $V_B$ is increased. After a voltage difference between a body and a drain of a transistor increases and reaches a particular value, a PN junction between the body and the drain is turned on. Consequently, a large quantity of harmonics are sharply generated in the radio frequency switch circuit, a serious non-linearity problem is also caused, and a power output capability of the radio frequency switch circuit is seriously reduced.

It can be seen that, for the radio frequency switch circuit using a transistor stack method shown in FIG. 1, because a voltage swing of the radio frequency switch circuit is unevenly distributed in a stack chain of the switch transistor, a non-linearity problem of the radio frequency switch circuit is deteriorated, and a power output capability is reduced.

Figure 2:
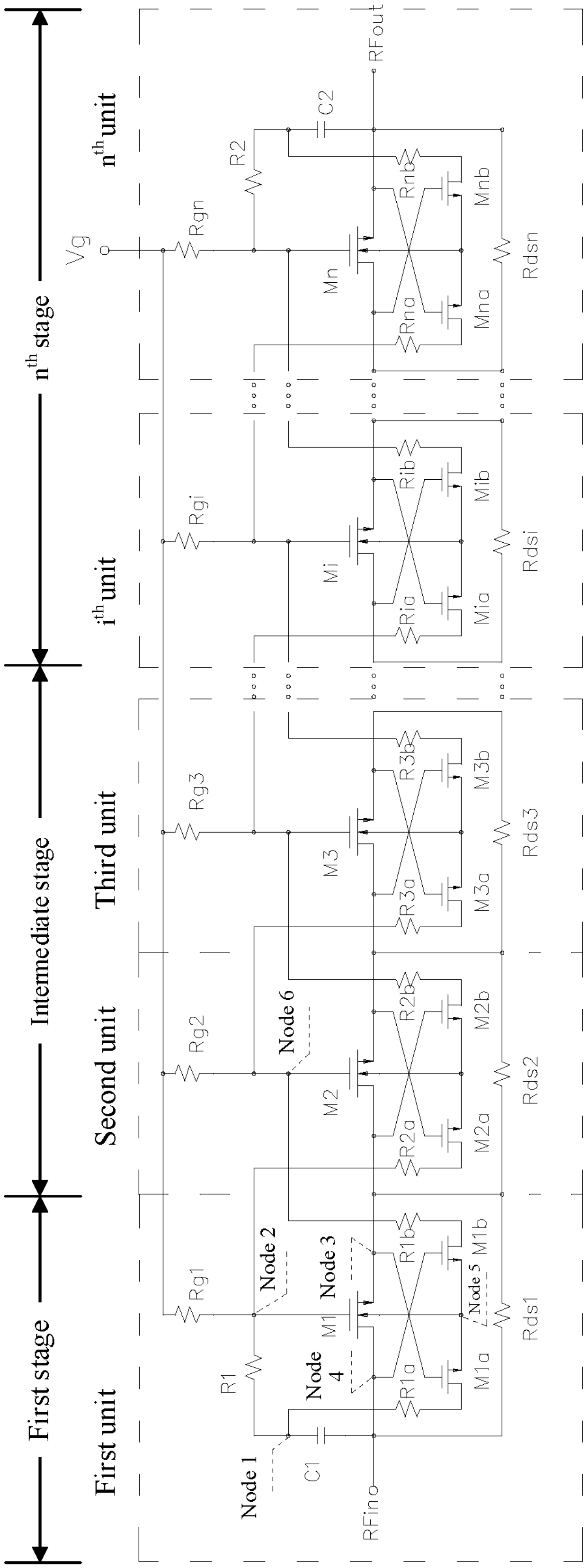
FIG. 2 is a diagram of a circuit principle of a radio frequency switch circuit according to a first embodiment of the present invention.

To resolve the foregoing problem of the radio frequency switch circuit, as shown in FIG. 2, an embodiment of the present invention provides a radio frequency switch circuit supporting a high-power mode. The radio frequency switch circuit includes n stages of switch transistor units (n is a positive integer, and n≥3) connected in series, and includes a first stage of switch transistor unit (that is, the start stage of switch transistor unit, that is, a first unit shown in FIG. 2), n−2 intermediate stages of switch transistor units (a second unit, a third unit, . . . , and an $i^{th}$ unit shown in FIG. 2, where i is a positive integer greater than 1 and less than n), and an $n^{th}$ stage of switch transistor unit (that is, the last stage of switch transistor unit, that is, an $n^{th}$ unit shown in FIG. 2). An input end of the first stage of switch transistor unit is connected to a signal input end RFin of the radio frequency switch circuit, and an output end of the first stage of switch transistor unit is connected to an input end of the start stage of unit of the n−2 intermediate stages of switch transistor units. The n−2 intermediate stages of switch transistor units are connected to each other in series. An output end of the $(n-1)^{th}$ intermediate stage of switch transistor unit is connected to an input end of the $n^{th}$ stage (that is, the last stage) of switch transistor unit, and an output end of the $n^{th}$ stage of switch transistor unit is connected to a signal output end RFout of the radio frequency switch circuit. The transistor described in the embodiments of the present invention is preferably an NMOS transistor, but may alternatively be a PMOS transistor.

As shown in FIG. 2, in a first embodiment of the present invention, the first stage of switch transistor unit includes a first transistor M1, a second transistor M1*a*, a third transistor M1*b*, a first resistor Rg1 (as a gate bias resistor), a second resistor R1*a*, a third resistor R1*b*, a fourth resistor Rds1 (as a path resistor), a fifth resistor R1, and a first capacitor C1. On one hand, a gate of the first transistor M1 is connected to the first resistor Rg1 and the fifth resistor R1, and on the other hand, is connected to the second resistor R2*a* in a next stage of switch transistor unit (that is, the first stage of the intermediate stages of switch transistor units). Another end of the first resistor Rg1 is connected to a gate bias voltage Vg, and another end of the fifth resistor R1 is connected to the first capacitor C1 and the second resistor R1*a*. A drain of the first transistor M1 is connected to a signal input end RFin of the radio frequency switch circuit and another end of the first capacitor C1. A source of the first transistor M1 is connected to a drain of a first transistor M2 in a next stage of switch transistor unit (that is, the first stage of the intermediate stages of switch transistor units). Two ends of the fourth resistor Rds1 are respectively connected to the drain and the source of the first transistor M1. A body of the first transistor M1 is connected to each of a source of the second transistor M1*a* and a source of the third transistor M1*b*. A gate of the second transistor M1*a* is connected to the source of the first transistor M1, and a gate of the third transistor M1*b* is connected to the drain of the first transistor M1. A drain of the second transistor M1*a* is connected to another end of the second resistor R1*a*, a drain of the third transistor M1*b* is connected to the third resistor R1*b*, and another end of the third resistor R1*b* is connected to a gate of the first transistor M2 in the first intermediate stage of switch transistor unit.

A body of the first transistor M1 passes through the second transistor M1*a*, the second resistor R1*a*, and the first capacitor C1. Two paths formed by the third transistor M1*b* and the third resistor R1*b* are respectively connected to the signal input end RFin of the radio frequency switch circuit and the gate of the first transistor M2 in the first intermediate stage of switch transistor unit. In addition, the body of the first transistor M1 is also connected to the gate of the first transistor M1 through a path formed by the second transistor M1*a*, the second resistor R1*a*, and the fifth resistor R1.

As shown in FIG. 2, in the first embodiment of the present invention, because circuit structures of the n−2 intermediate stages of switch transistor units are the same, an $i^{th}$ (i is a positive integer greater than 1 and less than n) intermediate stage of switch transistor unit is used as an example for specific description. The $i^{th}$ intermediate stage of switch transistor unit includes a first transistor Mi, a second transistor Mia, a third transistor Mib, a first resistor Rgi (which is used as a gate bias resistor), a second resistor Ria, a third resistor Rib, and a fourth resistor Rdsi (which is used as a path resistor). On one hand, a gate of the first transistor Mi is connected to the first resistor Rgi, and on the other hand, is connected to the second resistor $R_{(i+1)}$ a in a next stage (that is, an $(i+1)^{th}$ stage) of switch transistor unit and a third resistor $R_{(i-1)}$ b in a previous stage (that is, an $(i-1)^{th}$ stage) of switch transistor unit. Another end of the first resistor Rgi is connected to the gate bias voltage Vg. A drain of the first transistor Mi is connected to a source of a first transistor $M_{(i-1)}$ in a previous stage (that is, an $(i-1)^{th}$ stage) of switch transistor unit. A source of the first transistor Mi is connected to a drain of a first transistor $M_{(i+1)}$ in a next stage (that is, an $(i+1)^{th}$ stage) of switch transistor unit. Two ends of the fourth resistor Rdsi are respectively connected to the drain and the source of the first transistor Mi. A body of the first transistor Mi is connected to each of a source of the second transistor Mia and a source of the third transistor Mib. A gate of the second transistor Mia is connected to the source of the first transistor Mi, and a gate of the third transistor Mib is connected to the drain of the first transistor Mi. A drain of the second transistor Mia is connected to the second resistor Ria, and another end of the second resistor Ria is connected to a gate of the first transistor $M_{(i-1)}$ in the previous stage (that is, an $(i-1)^{th}$ stage) of switch transistor unit. A drain of the third transistor Mib is connected to a third resistor Rib, and another end of the third resistor Rib is connected to a gate of the first transistor $M_{(i+1)}$ in the next stage (that is, an $(i+1)^{th}$ stage) of switch transistor unit.

Through two paths formed by the second transistor Mia, the second resistor Ria, the third transistor Mib, and the third resistor Rib, the body of the first transistor Mi is connected to the gate of the first transistor $M_{(i-1)}$ in the previous stage (that is, the $(i-1)^{th}$ stage) of switch transistor unit and the gate of the first transistor $M_{(i+1)}$ in the next stage (that is, the $(i+1)^{th}$ stage) of switch transistor unit.

As shown in FIG. 2, in the first embodiment of the present invention, the $n^{th}$ stage (that is, the end stage) of switch transistor unit includes a first transistor Mn, a second transistor Mna, a third transistor Mnb, a first resistor Rgn (as a gate bias resistor), a second resistor Rna, a third resistor Rnb, a fourth resistor Rdsn (as a path resistor), a sixth resistor R2, and a second capacitor C2. On one hand, a gate of the first transistor Mn is connected to the first resistor Rgn and the sixth resistor R2, and on the other hand, is connected to a third resistor $R_{(n-1)}$b in a previous stage (that is, an $(n-1)^{th}$ stage) of switch transistor unit. Another end of the first resistor Rgn is connected to a gate bias voltage Vg. Another end of the sixth resistor R2 is connected to the second capacitor C2 and the third resistor Rnb. A drain of the first transistor Mn is connected to a source of a first transistor $M_{(n-1)}$ in a previous stage (that is, an $(n-1)^{th}$ stage) of switch transistor unit. A source of the first transistor Mn is connected to a signal output end RFout of the radio frequency switch circuit and another end of the second capacitor C2. Two ends of the fourth resistor Rdsn are respectively connected to the drain and the source of the first transistor Mn. A body of the first transistor Mn is connected to each of a source of the second transistor Mna and a source of the third transistor Mnb. A gate of the second transistor Mna is connected to the source of the first transistor Mn, and a gate of the third transistor Mnb is connected to the drain of the first transistor Mn. A drain of the second transistor Mna is connected to the second resistor Rna, and another end of the second resistor Rna is connected to a gate of the first transistor $M_{(n-1)}$ in the previous stage (that is, an $(n-1)^{th}$ stage) of switch transistor unit. A drain of the third transistor Mnb is connected to another end of the third resistor Rnb.

The body of the first transistor Mn passes through the second transistor Mna and the second resistor Rna. Two paths formed by the third transistor Mnb, the third resistor Rnb, and the second capacitor C2 are respectively connected to the gate of the first transistor $M_{(n-1)}$ in the previous stage (that is, the $(n-1)^{th}$ stage) of switch transistor unit and the signal output end RFout of the radio frequency switch circuit. In addition, the body of the first transistor Mn is also connected to the gate of the first transistor Mn through a path formed by the third transistor Mnb, the third resistor Rnb, and the sixth resistor R2.

It should be noted that, the radio frequency switch circuit shown in the foregoing embodiment may further include various forms of variations. For example, in a second embodiment shown in FIG. 3, the radio frequency switch circuit includes n (n is a positive integer, and n≥3) stages of switch transistor units connected in series, and includes a first stage of switch transistor unit, n−2 intermediate stages of switch transistor units, and an $n^{th}$ stage (end stage) of switch transistor unit. A difference from the first embodiment shown in FIG. 2 is as follows: In the first embodiment, the gate bias resistor of the first transistor in each stage of switch transistor unit is directly connected to the gate bias voltage Vg. In the second embodiment shown in FIG. 3, the gate bias resistors of the first transistors in all the stages of switch transistor units are sequentially connected to each other in series, and are then connected to the gate bias voltage Vg. Besides, other circuit structures of the first embodiment and the second embodiment are completely the same, and details are not described herein again.

An operating principle of the radio frequency switch circuit provided in the foregoing embodiments is analyzed in detail below.

In the radio frequency switch circuit provided by the present invention, operating states of all stages of switch transistor units are the same or similar. Therefore, the first stage of switch transistor unit is used as an example for detailed description.

As shown in FIG. 2, when the radio frequency switch circuit is in a turned-on state, the first transistor M1 is in a turned-on state, and alternating-current voltages at a node 3 and a node 4 are approximately the same. Because a parasite capacitance between the gate and the drain of the first transistor M1 is approximately the same as a parasite capacitance between the gate and the source of the first transistor, an alternating-current voltage at a node 2 is also approximately the same as the alternating-current voltages at the node 4 and the node 3. Meanwhile, an alternating-current voltage at a node 1 is also the same as the alternating-current voltages at the node 4, the node 3, and the node 2. In this case, a positive gate bias voltage Vg exists at the node 2 and the node 1, a direct-current voltage at the node 3 and the node 4 is 0, and the second transistor M1*a* and the third transistor M1*b* are both in a turned-off state. Therefore, this avoids that the PN junction among the body, the source, and the drain of the first transistor M1 is turned on due to increase of a direct-current voltage of the body. At the same time, this avoids problems of on-resistance increase and insertion loss increase that are caused by decrease of an alternating-current voltage of the gate of the first transistor M1.

When the radio frequency switch circuit is in a turned-off state, the first transistor M1 is in a turned-off state, a negative gate bias voltage Vg exists at the node 2 and the node 1, and the direct-current voltage at the node 3 and the node 4 is 0. In this case, the second transistor M1*a* and the third transistor M1*b* are in a turned-on state. Therefore, a body bias voltage of the first transistor M1 is approximately the same as the gate bias voltage Vg.

In an embodiment of the present invention, a resistance value of the second resistor R1*a* is set to a level of kilo-Ohm, a resistance value of the fifth resistor R1 is set to a level of kilo-Ohm, and a capacitance value of the first capacitor C1 is set to a level of fF. When a radio frequency signal is inputted to the signal input end RFin of the radio frequency switch circuit, an alternating-current voltage at a node 5 is half of a sum of the alternating-current voltages at the node 3 and the node 4, and an alternating-current voltage at the node 2 is half of a sum of the alternating-current voltages at the node 3 and the node 4. That is, in this case, the alternating-current voltages at the gate and the body of the first transistor M1 are approximately the same.

Compared with the prior art shown in FIG. 1, in the radio frequency switch circuit provided in this embodiment of the present invention, on one hand, gates and bodies of the first transistors M1, M2, M3, . . . , and Mn in the n stages of switch transistor units have only one alternating current leakage path towards the gate direction. Therefore, a proportion of alternating current of an inputted radio frequency signal passing through the first transistors M1, M2, M3, . . . , and Mn in all the stages of switch transistor units increases. From the positive perspective, voltage distribution imbalance of the first transistors M1, M2, M3, . . . , and Mn in all the stages of switch transistor units is alleviated. From the negative perspective, in the first transistors M1, M2, M3, . . . , and Mn in all the stages of switch transistor units, a direct-current voltage of the body increases only when inputted power is higher. Therefore, the radio frequency switch circuit provided by this embodiment of the present invention effectively alleviates a non-linearity problem of a switch transistor, and improves a power output capability of the radio frequency switch circuit. On the other hand, because the body of the first transistor in each stage of switch transistor unit is not provided with a bias resistor, compared with the prior art shown in FIG. 1, insertion loss of the radio frequency switch circuit is obviously reduced.

It should be noted that, the embodiments or variations of the present invention are described in an associated manner, and for the same and similar parts between the embodiments or variations, reference may be made to each other. The descriptions of the embodiments or variations focus on the difference from other embodiments, but all are implemented based on the working principle of the radio frequency switch circuit. Details are not described herein again.

Figure 3:
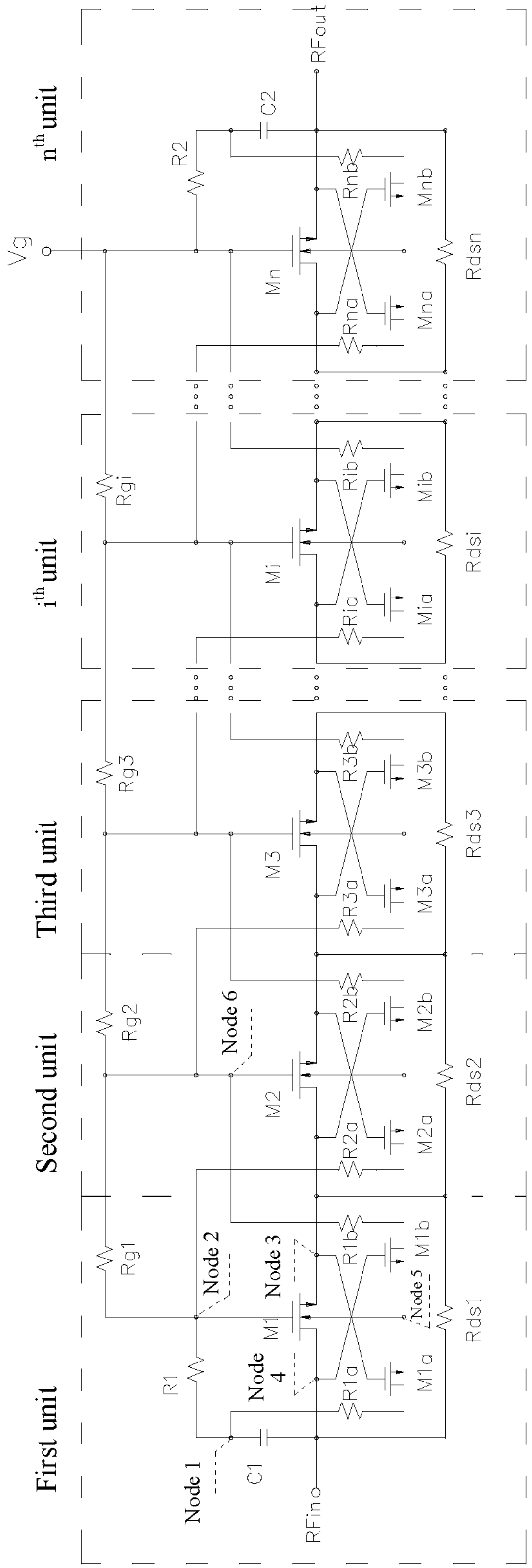
FIG. 3 is a diagram of a circuit principle of a radio frequency switch circuit according to a second embodiment of the present invention.

To verify the excellent performance of the radio frequency switch circuit provided by the embodiments of the present invention, the inventor performs multiple comparison simulation tests on the existing technical solution shown in FIG. 1 and the technical solution shown in FIG. 2 or FIG. 3 provided by the embodiments of the present invention.

Figure 4:
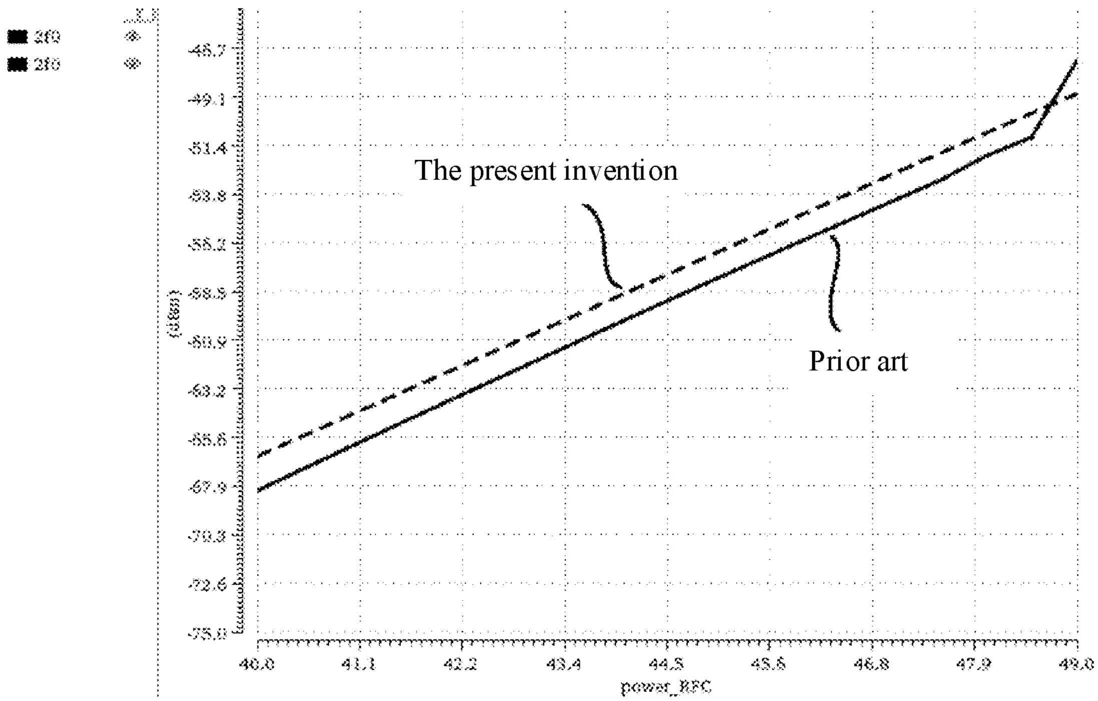
FIG. 4 is a comparison diagram of a simulation test of a second-order harmonic of a radio frequency switch circuit according to the present invention.

FIG. 4 shows a simulation test result of a second-order harmonic of a radio frequency switch circuit. A horizontal coordinate represents radio frequency power, and a vertical coordinate represents a second-order harmonic value. As can be seen from FIG. 2, after inputted radio frequency power reaches a power threshold, the radio frequency switch circuit in the existing technical solution experiences harmonic mutation and sharp non-linearity deterioration. However, in the radio frequency switch circuit provided in the embodiments of the present invention, after the inputted power reaches the threshold, the harmonic characteristic still falls within a linearly increasing range.

Figure 5:
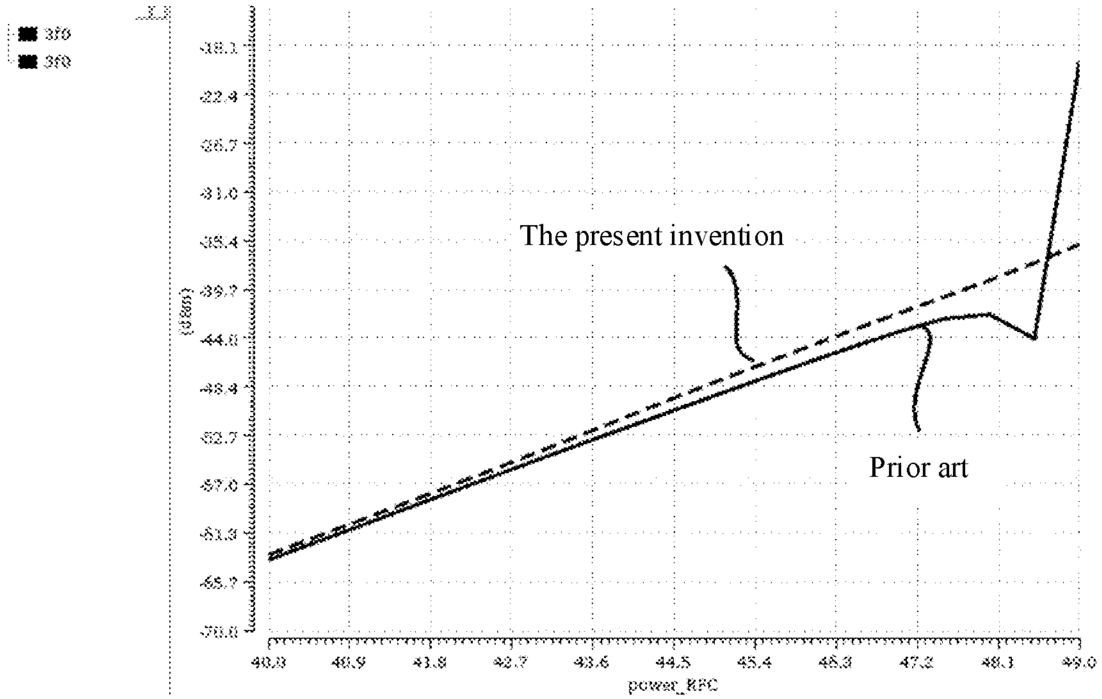
FIG. 5 is a comparison diagram of a simulation test of a third-order harmonic of a radio frequency switch circuit according to the present invention.

FIG. 5 shows a simulation test result of a third-order harmonic of a radio frequency switch circuit. A horizontal coordinate represents radio frequency power, and a vertical coordinate represents a third-order harmonic value. As can be seen from FIG. 5, after inputted radio frequency power reaches a power threshold, the radio frequency switch circuit in the existing technical solution experiences harmonic mutation and sharp non-linearity deterioration. However, in the radio frequency switch circuit provided in the embodiments of the present invention, after the inputted power reaches the threshold, the harmonic characteristic still falls within a linearly increasing range.

Figure 6:
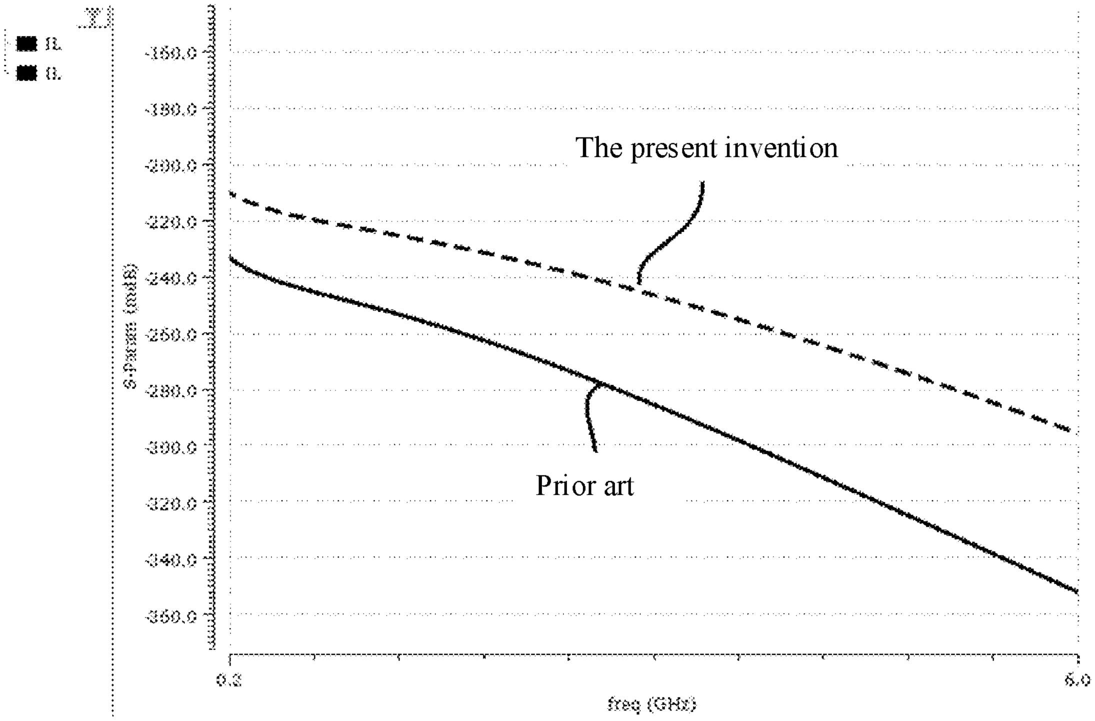
FIG. 6 is a comparison diagram of a simulation test of insertion loss of a radio frequency switch circuit according to the present invention.

FIG. 6 shows a simulation test result of insertion loss of a radio frequency switch circuit. A horizontal coordinate represents a frequency of a radio frequency signal, and a vertical coordinate represents insertion loss. As can be seen from FIG. 6, in a frequency range of 0.2 GHz to 6 GHz, insertion loss of the radio frequency switch circuit provided in the embodiments of the present invention is obviously better than insertion loss in the existing technical solution.

Figure 7:
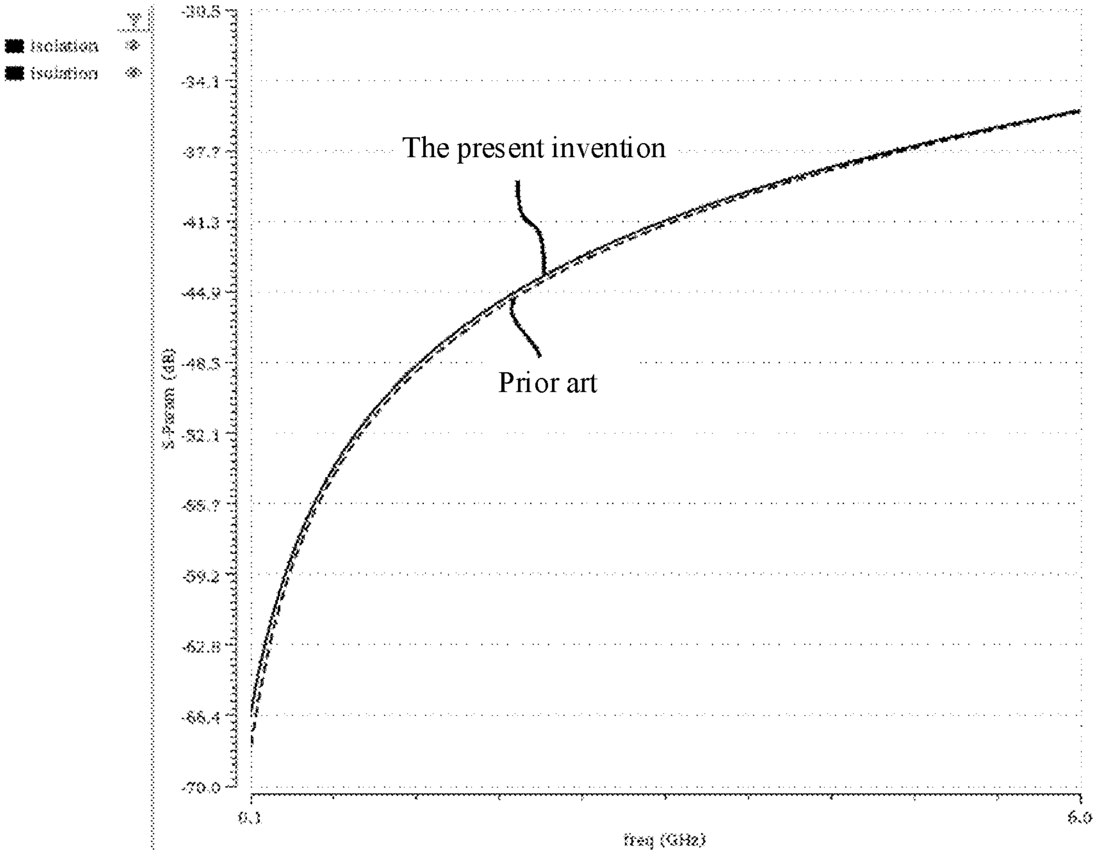
FIG. 7 is a comparison diagram of a simulation test of an isolation degree of a radio frequency switch circuit according to the present invention.

FIG. 7 shows a simulation test result of an isolation degree of a radio frequency switch circuit. A horizontal coordinate represents a frequency of a radio frequency signal, and a vertical coordinate represents an isolation degree. As can be seen from FIG. 7, in a frequency range of 0.2 GHz to 6 GHz, an isolation degree of the radio frequency switch circuit provided in the embodiments of the present invention is very close to an isolation degree of the radio frequency switch circuit in the existing technical solution, and basically does not change.

The embodiments of the present invention further provide an integrated circuit chip. The integrated circuit chip includes the radio frequency switch circuit supporting a high-power mode provided in the foregoing embodiments, is used in a radio frequency front-end module in a wireless communications system, and functions to accurately switch and control a transmission path of a radio frequency signal and perform gating for a corresponding radio frequency path. A specific structure of the radio frequency switch circuit in the integrated circuit chip is not described in detail herein.

In addition, the radio frequency switch circuit provided in the present invention may further be used in an electronic device as an important part of a communications component. The electronic device herein is a computer device that can be used in a mobile environment and supports various communication standards such as GSM, EDGE, TD_SCDMA, TDD_LTE, FDD_LTE, and 5G, and includes a mobile phone, a notebook computer, a tablet computer, an in-vehicle computer, and the like. In addition, the technical solution provided in the present invention is also applicable to an application scenario of other communications components, such as a communications base station.

Figure 8:
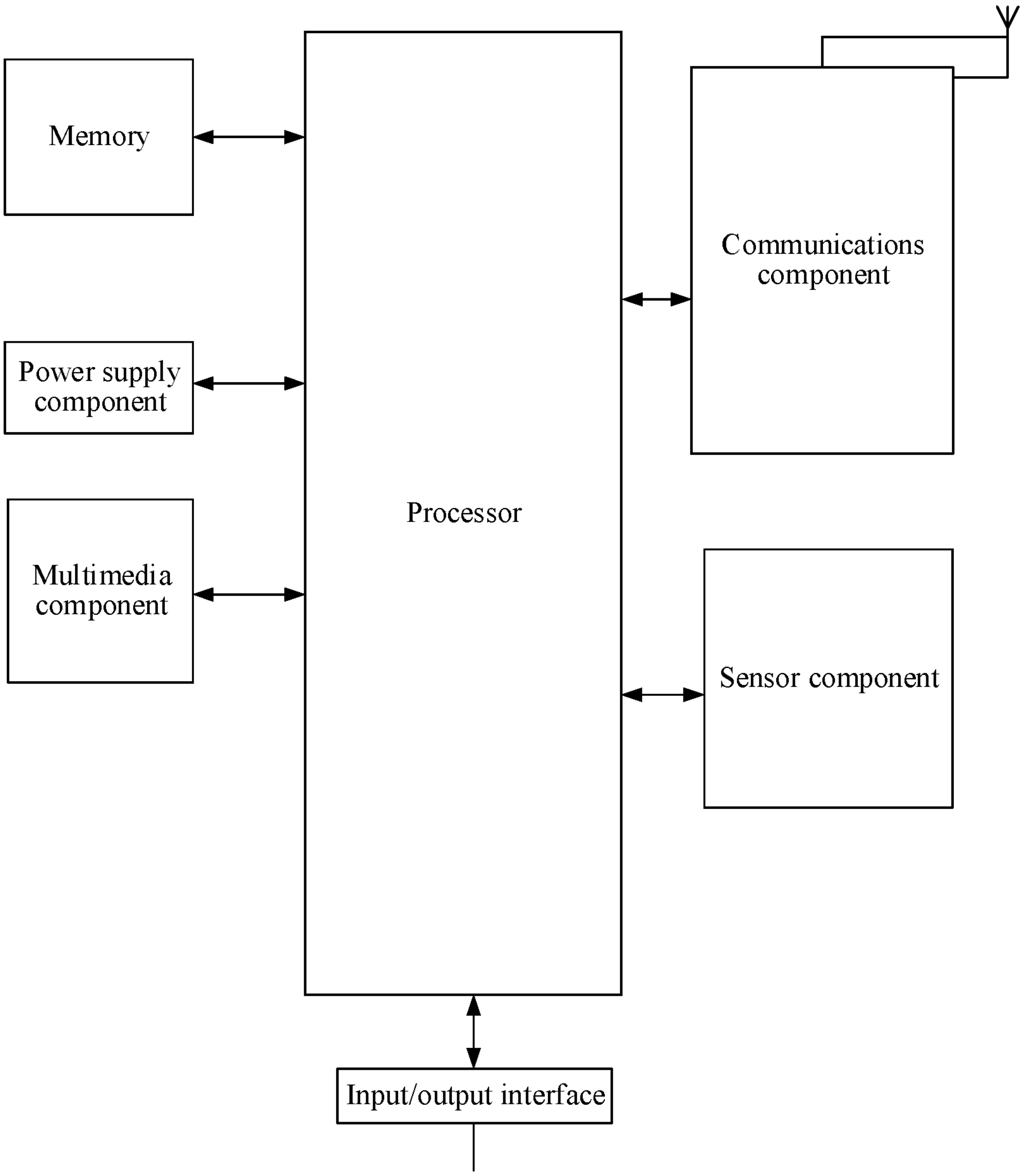
FIG. 8 is a schematic diagram of an electronic device using a radio frequency switch circuit provided in the present invention.

As shown in FIG. 8, the electronic device includes at least a processor and a memory, and may further include a communications component, a sensor component, a power supply component, a multimedia component, and an input/output interface according to an actual requirement. The memory, the communications component, the sensor component, the power supply component, the multimedia component, and the input/output interface are all connected to the processor. The memory may be a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, or the like. The processor may be a central processing unit (CPU), a graphic processing unit (GPU), a field programmable gate array (FPGA), an application-specific integrated circuit (ASIC), a digital signal processing (DSP) chip, or the like. Other communications components, sensor components, power supply components, multimedia components, and the like may all be implemented by using common components, and are not specifically described herein.

As can be seen from the specific descriptions of the technical solutions of the present invention in the foregoing embodiments, in the radio frequency switch circuit supporting a high-power mode provided in the present invention, on one hand, a technical solution in which a gate of each stage of switch transistor is connected to a gate bias voltage by using a resistor structure is provided. On the other hand, a technical solution in which a bias circuit formed by a switch transistor and a resistor is used for a body of each stage of switch transistor and an end of the bias circuit is connected to a gate of the switch transistor is provided. This effectively alleviates uneven distribution of a voltage swing in a stack chain of each stage of switch transistor, so that a nonlinearity problem of the radio frequency switch circuit is alleviated, insertion loss is reduced, and a power output capability is obviously improved. Therefore, the radio frequency switch circuit supporting a high-power mode provided in the present invention has beneficial effects such as skillful structural design, relatively low production costs, a relatively small chip size, and excellent operating performance.

The foregoing describes in detail the radio frequency switch circuit supporting a high-power mode, the chip, and the electronic device thereof provided in the present invention. Any obvious change made by a person of ordinary skill in the art to the present invention without departing from the essence of the present invention shall fall within the protection scope of the present invention.

What is claimed is:

1. A radio frequency switch circuit supporting a high-power mode, comprising a plurality of stages of switch transistor units connected in series; wherein each stage of switch transistor unit comprises a first transistor, a second transistor, a third transistor, a gate bias resistor, and a path resistor;

a gate of the first transistor is connected to the gate bias resistor, and another end of the gate bias resistor is connected to a gate bias voltage; and a drain of the first transistor is connected to a source of a first transistor in a previous stage of switch transistor unit, and a source of the first transistor is connected to a drain of a first transistor in a next stage of switch transistor unit; and two ends of the path resistor are respectively connected to the drain and the source of the first transistor, and a body of the first transistor is connected to each of a source of the second transistor and a source of the third transistor; and a gate of the second transistor is connected to the source of the first transistor, and a gate of the third transistor is connected to the drain of the first transistor.

2. The radio frequency switch circuit according to claim 1, wherein a drain of the second transistor is connected to a second resistor, and another end of the second resistor is connected to a gate of the first transistor in the previous stage of switch transistor unit; and a drain of the third transistor is connected to a third resistor, and another end of the third resistor is connected to a gate of the first transistor in the next stage of switch transistor unit.

3. The radio frequency switch circuit according to claim 2, wherein the gate of the first transistor is connected to each of a second resistor in the next stage of switch transistor unit and a third resistor in the previous stage of switch transistor unit.

4. The radio frequency switch circuit according to claim 2, wherein a fifth resistor and a first capacitor are further comprised at the start stage of the plurality of stages of switch transistor units;

one end of the fifth resistor is connected to a gate of a first transistor in the current stage of switch transistor unit, and another end of the fifth resistor is connected to the first capacitor; and another end of the first capacitor is connected to a drain of the first transistor.

5. The radio frequency switch circuit according to claim 4, wherein the drain of the first transistor is connected to a signal input end of the radio frequency switch circuit.

6. The radio frequency switch circuit according to claim 2, wherein a sixth resistor and a second capacitor are further comprised at the end stage of the plurality of stages of switch transistor units;

one end of the sixth resistor is connected to a gate of a first transistor in the current stage of switch transistor unit, and another end of the sixth resistor is connected to the second capacitor; and another end of the second capacitor is connected to a source of the first transistor.

7. The radio frequency switch circuit according to claim 6, wherein the source of the first transistor is connected to a signal output end of the radio frequency switch circuit.

8. The radio frequency switch circuit according to claim 1, wherein the gate bias resistors in the stages of switch transistor units are sequentially connected to each other in series, and then are connected to the gate bias voltage.

9. An integrated circuit chip, comprising the radio frequency switch circuit according to claim 1.

10. An electronic device, comprising the radio frequency switch circuit according to claim 1.

* * * * *